(12) United States Patent
Patti

(10) Patent No.: US 8,878,594 B2
(45) Date of Patent: Nov. 4, 2014

(54) IGBT DEVICE WITH BURIED EMITTER REGIONS

(75) Inventor: Davide Giuseppe Patti, Mascalucia (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 54 days.

(21) Appl. No.: 13/300,010

(22) Filed: Nov. 18, 2011

(65) Prior Publication Data

US 2012/0126880 A1    May 24, 2012

(30) Foreign Application Priority Data

Nov. 19, 2010  (IT) .............................. MI2010A2146

(51) Int. Cl.
*H01L 29/739* (2006.01)
*H03K 17/12* (2006.01)
*H03K 17/16* (2006.01)
*H01L 29/08* (2006.01)

(52) U.S. Cl.
CPC ........ *H01L 29/7395* (2013.01); *H01L 29/0834* (2013.01)
USPC ........... 327/432; 438/138; 438/234; 257/273; 257/E21.382; 257/E29.197

(58) Field of Classification Search
USPC .................................................. 327/432, 433
See application file for complete search history.

(56) References Cited

U.S. PATENT DOCUMENTS

| | | | | |
|---|---|---|---|---|
| 4,303,841 A * | 12/1981 | Baker | ............................ | 327/432 |
| 4,782,379 A | 11/1988 | Baliga | | |
| 4,941,030 A * | 7/1990 | Majumdar | .................... | 257/378 |
| 5,055,721 A * | 10/1991 | Majumdar et al. | ............ | 327/434 |
| 5,198,688 A * | 3/1993 | Tsuchiya et al. | ............... | 257/144 |
| 5,378,903 A * | 1/1995 | Otsuki et al. | ................... | 257/133 |
| 5,436,486 A * | 7/1995 | Fujishima et al. | ............ | 257/378 |
| 5,538,908 A * | 7/1996 | Kim | .............................. | 438/204 |
| 5,548,133 A * | 8/1996 | Kinzer | .......................... | 257/155 |
| 6,242,967 B1 * | 6/2001 | Iwamuro et al. | ............... | 327/432 |
| 6,275,093 B1 * | 8/2001 | Shekhawat et al. | ........... | 327/434 |
| 6,448,587 B1 * | 9/2002 | Kohno et al. | .................. | 257/133 |
| 2007/0215981 A1 | 9/2007 | Schulze et al. | | |
| 2008/0283868 A1 | 11/2008 | Schulze et al. | | |

FOREIGN PATENT DOCUMENTS

| | | |
|---|---|---|
| EP | 0528349 | 2/1993 |
| JP | 63211680 | 9/1988 |

OTHER PUBLICATIONS

Search Report for Italian Application No. MI20102146, Ministero dello Sviluppo Economico, Jun. 20, 2011, pp. 3.

* cited by examiner

*Primary Examiner* — Lincoln Donovan
*Assistant Examiner* — Terry L Englund
(74) *Attorney, Agent, or Firm* — Graybeal Jackson LLP

(57) ABSTRACT

An embodiment of an IGBT device is integrated in a chip of semiconductor material including a substrate of a first type of conductivity, an active layer of a second type of conductivity formed on an inner surface of the substrate, a body region of the first type of conductivity extending within the active layer from a front surface thereof opposite the inner surface, a source region of the second type of conductivity extending within the body region from the front surface, a channel region being defined within the body region between the source region and the active layer, a gate element insulated from the front surface extending over the channel region, a collector terminal contacting the substrate on a rear surface thereof opposite the inner surface, an emitter terminal contacting the source region and the body region on the front surface, and a gate terminal contacting the gate element.

18 Claims, 6 Drawing Sheets

IGBT DEVICE WITH BURIED EMITTER REGIONS

PRIORITY CLAIM

The instant application claims priority to Italian Patent Application No. MI2010A002146, filed Nov. 19, 2010, which application is incorporated herein by reference in its entirety.

TECHNICAL FIELD

One or more embodiments embodiment generally relate to the electronic field. More specifically, one or more embodiments relate to power devices.

BACKGROUND

Power devices are commonly used in many applications wherein it is necessary to provide high currents (e.g., up to 1-100 A), so as to be able to drive high inductive loads (e.g., for controlling motors in industrial applications) or capacitive loads, and withstand high voltages at their terminals (e.g., up to 400-1,600V).

For example, a widely used class of power devices is represented by IGBTs ("Insulated Gate Bipolar Transistor"), which are able to combine advantages being offered by field effect transistors (MOSFET, or simply MOS) and bipolar transistors (BJT), i.e., voltage driving and low output resistance, respectively.

An IGBT device is formed by a MOS transistor (e.g., an N-channel MOS transistor) and a bipolar transistor (e.g., a PNP bipolar transistor) coupled to each other; in particular, a base of the bipolar transistor may be coupled to a drain of the MOS transistor, whereas a collector of the bipolar transistor may be coupled to a source and a body of the MOS transistor. The IGBT device has an emitter terminal coupled to the source of the MOS transistor, a collector terminal coupled to an emitter of the bipolar transistor, and a gate terminal coupled to a gate of the MOS transistor; when a command signal is applied to the gate terminal, the IGBT device can enable a corresponding current to flow between the emitter terminal and the collector terminal thereof.

In this way, during the operation of the IGBT device, the bipolar transistor has a conductivity modulation effect on the drain of the MOS transistor; this implies a reduced voltage drop across the MOS transistor terminals and a high available current density, which in turn implies the possibility of integrating a very large number of IGBT devices in a same chip of semiconductor material.

Although IGBT devices have a widespread diffusion and are largely used, they have some drawbacks that preclude a wider use thereof, for example, in particular applications that require high performance and reliability.

In fact, as it is known, each IGBT device typically has a composite structure including layers with different types and/or concentrations of doping being alternated to each other; such a structure usually introduces undesired parasitic elements that may modify the correct operation of the IGBT device, or even cause the breakdown thereof even in a relatively short time.

Such parasitic elements mainly include a parasitic resistor coupled between the collector of the bipolar transistor and the emitter terminal of the IGBT device, and a parasitic bipolar transistor (with polarity being opposite that of the bipolar transistor—i.e., of NPN type in the case at issue); the parasitic transistor gives rise, in combination with the bipolar transistor, to a parasitic thyristor that may be enabled by an excessive potential difference across the parasitic resistor.

In particular, during the operation of the IGBT device, a certain possibility exists that leakage currents present therein pass through the parasitic resistor, thereby causing a potential difference across it that might reach such a level to turn on the parasitic transistor. Moreover, if during such condition a variation of electrical parameters of the bipolar transistor and the parasitic transistor (e.g., current gain) also occurs, then the parasitic thyristor may cause an uncontrolled current path between the emitter terminal and the collector terminal of the IGBT device, thereby triggering a self-generating effect of current multiplication (known as latch-up) that typically causes the breakdown of the IGBT device.

SUMMARY

In its general terms, an embodiment is based on the idea of providing one or more buried emitter regions.

More specifically, an embodiment is an IGBT device that is integrated in a chip of semiconductor material including a substrate of a first type of conductivity, and an active layer of a second type of conductivity formed on an inner surface of the substrate (for example, one or more epitaxial layers). A body region of the first type of conductivity extends within the active layer from a front surface thereof (opposite the inner surface); a source region of the second type of conductivity extends within the body region from the front surface (with a channel region that is defined within the body region between the source region and the active layer). A gate element (insulated from the front surface) extends over the channel region. A collector terminal contacts the substrate on a rear surface thereof (opposite the inner surface), an emitter terminal contacts the source region and the body region on the front surface, and a gate terminal contacts the gate element. In an embodiment, the IGBT device includes at least one buried emitter region of the first type of conductivity, with a concentration of impurities higher than a concentration of impurities of the substrate (for example, P++ and P, respectively); each buried emitter region is formed in a corresponding portion of the substrate (for example, it extends therein from its inner boundary). A further portion of the substrate interposed between the at least one buried emitter region and the collector terminal defines an emitter resistor.

Another embodiment is an IGBT complex structure including a plurality of such IGBT devices.

A further embodiment is a corresponding method for integrating an IGBT device in a chip of semiconductor material.

BRIEF DESCRIPTION OF THE DRAWINGS

One or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In particular.

DETAILED DESCRIPTION

Figure 1A:
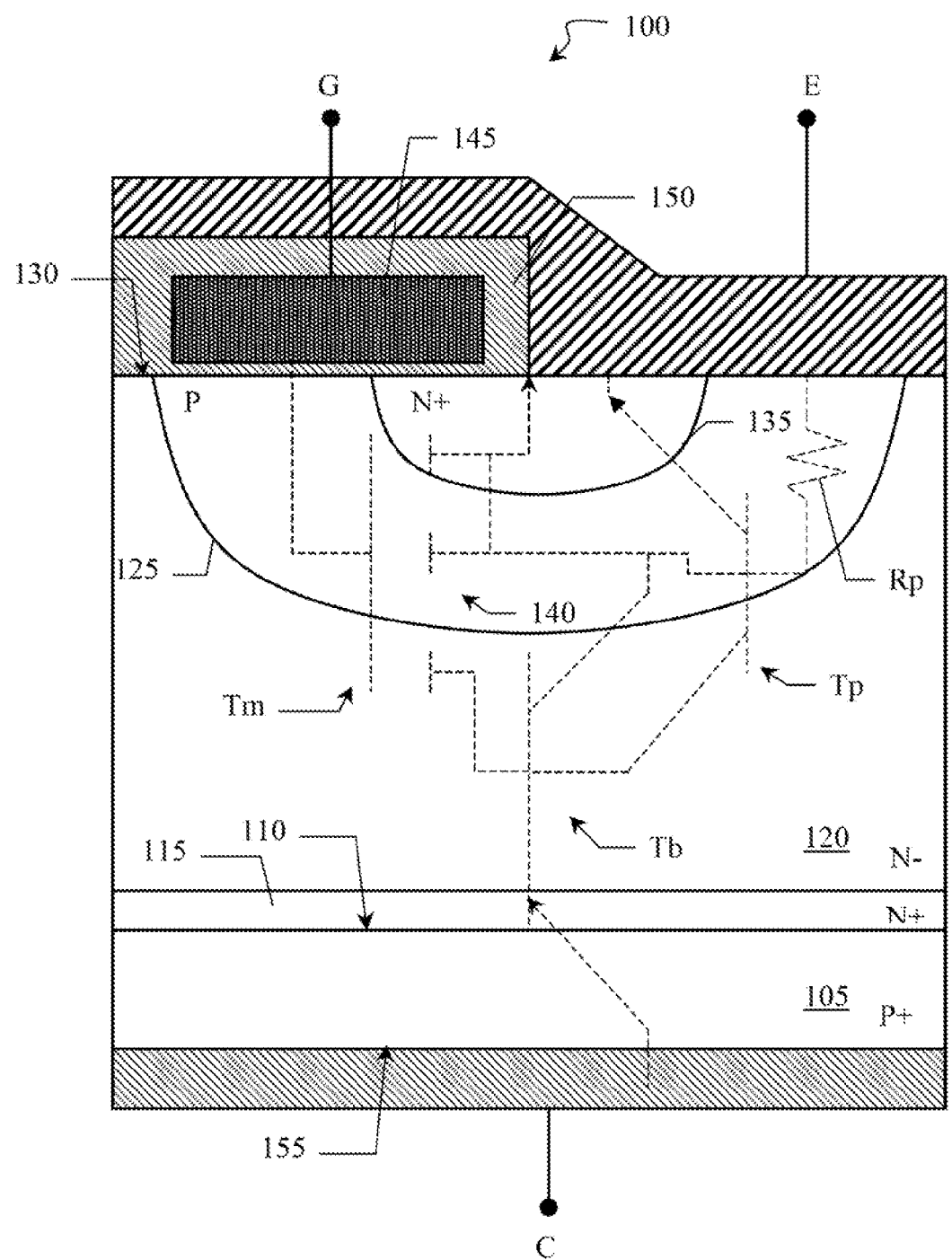
FIG. 1A shows a schematic sectional view of a structure of an IGBT device and a corresponding equivalent electronic circuit.

With reference in particular to FIG. 1A, it shows a schematic sectional view of a structure of an IGBT device 100 and a corresponding equivalent electronic circuit (represented by broken lines). Typically, the same structure is integrated in large numbers in several identical areas of a chip of semiconductor material, which are subsequently separated, in groups or individually, by a cutting operation. As usual, N-type and P-type dopant (or impurities) concentrations are denoted by adding the sign + or the sign − to the letters N and P to indicate a relatively high or relatively low impurity concentration, respectively, or the sign ++ or the sign −− to indicate a relatively very high or a relatively very low impurity concentration, respectively; the letters N and P without the addition of any sign instead denote relatively intermediate concentrations.

The IGBT device 100 includes a substrate 105 of semiconductor material (e.g., of P+ type), on an inner surface 110 thereof an active layer is present; in particular, the active layer includes a buffer layer 115 of N+ type (for example, with impurity concentrations of about $10^{17}$ ions/cm$^3$) being epitaxially grown on the substrate 105, and a drift layer 120 of N− type (for example, with dopant concentrations of about $10^{14}$ ions/cm$^3$) being epitaxially grown on the buffer layer 115.

A body region 125 of P type is implanted and diffused within the drift layer 120, so as to extend therein from a free surface thereof (opposite the inner surface 110 of the substrate 105) that defines a front surface 130 of the chip. A source region 135 of N+ type is implanted and diffused within the body region 125, so as to extend therein from the front surface 130; therefore, a channel region 140 is defined within the body region 125 between the source region 135 and the active layer 115, 120. A gate element 145 (e.g., of undoped polycrystalline silicon) is present over the channel region 140, and is surrounded by a suitable insulating layer 150 (so as to be insulated from the front surface 130).

The IGBT device 100 further includes a collector terminal C that contacts the substrate 105 on a free surface thereof (opposite the inner surface 110), which defines a rear surface 155 of the chip, an emitter terminal E that contacts the source region 135 and the body region 125 on the front surface 130, and a gate terminal G that contacts the gate element 145 (through a corresponding window being opened through the insulating layer 150); for example, such terminals C, E, and G are obtained by known photolithography, deposition, and etching processes.

In this way, as visible in the equivalent electronic circuit shown in the same figure, the substrate 105 (P+), the active layer 115,120 (N+ and N−), and the body region 125 (P) implement an emitter, a base, and a collector, respectively, of a (vertical structure PNP power) bipolar transistor Tb, whereas the active layer 115,120 (N+ and N−), the body region 125 (P), the source region 135 (N+) and the gate element 145 implement a drain, a body, a source and a gate, respectively, of a (vertical structure N-channel power) MOS transistor Tm.

The MOS transistor Tm and the bipolar transistor Tb are coupled to each other so that the base of the bipolar transistor Tb is coupled to the drain of the MOS transistor Tm (common active layer 115,120), whereas the collector of the bipolar transistor Tb is coupled to the body of the MOS transistor Tm (common body region 125), and thus also to its source (through the emitter terminal E).

The structure described above is affected by the presence of parasitic elements; among them, relevant ones for the purposes of the present description are a parasitic resistor Rp (forming within the body region 125), and a (lateral structure NPN) parasitic bipolar transistor Tp; in particular, the parasitic transistor Tp includes an emitter, a base and a collector that are defined by the source region 135 (N+), by the body region 125 (P), and by the active layer 115,120 (N+ and N−), respectively.

As visible in the figure, the parasitic resistor Rp is functionally coupled between the emitter terminal E and the base of the parasitic transistor Tp; the parasitic transistor Tp has the base coupled to the collector of the bipolar transistor Tb (common body region 125), the collector coupled to the base of the bipolar transistor Tb (common active layer 115,120), and the emitter coupled to the source of the MOS transistor Tm (common source region 135); in this way, the bipolar transistor Tb and the parasitic transistor Tp define a thyristor (or SCR).

In order to illustrate the principles of operation of the IGBT device 100, reference will now be made to FIG. 1B, which only shows the equivalent electronic circuit of FIG. 1A (with components arranged differently for the sake of simplicity).

Omitting at first the parasitic resistor Rp and the parasitic transistor Tp for the sake of convenience, the principles of operation of the IGBT device 100 can be summarized as follows.

Starting from a turned off condition of the IGBT device 100, when a command voltage applied between the gate terminal G and the emitter terminal E (and thus between the gate and the source of the MOS transistor Tm) reaches a threshold voltage of the MOS transistor Tm (e.g., 1V), the latter turns on thereby allowing a passage of a current I1 from its drain to its source. Such current I1 exits from the base of the bipolar transistor Tb; therefore, a current I2 proportional to the current I1 and depending on a current gain $\beta_B$ of the bipolar transistor Tb (in turn depending on, for example, the thickness and/or doping concentration of the buffer layer) will flow within the collector of the bipolar transistor TB.

In particular, it will result that:

$$I2 = I1 * \beta_B$$

The current I2 then reaches the emitter terminal E, thereby adding to the current I1 to form a total current Itot:

$$Itot = I1 + I2 = I1 + I1*\beta_B = I1(1+\beta_B)$$

Since typically the bipolar transistor Tb is designed so that its gain factor $\beta_B$ is lower than 1 (as will be explained in the following), the quantity $(1+\beta_B)$ is usually between 1 and 2. Therefore, at the emitter terminal E there is obtained a current Itot greater than the current I1 that the MOS transistor Tm alone is capable of providing. Moreover, thanks to the highly doped buffer layer that injects charge carriers into the (weakly doped) drift layer, there is obtained a modulation effect of the conductivity of the channel region forming within the active layer; this implies a reduced voltage drop between the drain and the source of the MOS transistor Tm (thereby obtaining a saving of dissipated electric power), and a high available current density (thereby allowing a remarkable integration capability of the IGBT device 100).

Considering now the parasitic resistor Rp and the parasitic transistor Tp as well, in case leakage currents (defined by uncontrollable partitions of the currents I1 and I2) should flow through the parasitic resistor Rp, the latter will develop a corresponding potential difference at its terminals (and hence between the base and the emitter of the parasitic transistor Tp). If such potential difference reaches a threshold voltage of the parasitic transistor Tp (e.g., 0.7V), the latter turns on; in this way, a current I3 will start flowing towards the base of the parasitic transistor Tp, and a corresponding current I4 will exit from its emitter. As above, the currents I3 and I4 are proportional to each other, and in particular depend on a current gain $\beta_P$ of the parasitic transistor Tp:

$$I4=I3*(1+\beta_P)$$

In order to avoid that the thyristor formed by Tb and Tp causes uncontrolled current paths by triggering a self-sustained degenerative effect of current multiplication (latch-up), for which the current flowing within the circuit increases uncontrollably, the following inequality should be verified:

$$I1>I3+I4$$

that is, the collector current of the parasitic transistor Tp should not entirely consume the current coming from the base of the bipolar transistor Tb (for which in such case I1 would equal zero such that no current would flow through the MOS transistor Tm), and the collector current of the bipolar transistor Tb should not be entirely consumed by the current into the base of the parasitic transistor Tp (e.g., I2≠I3).

From the terms of the inequality by virtue of the relationships expressed before (and setting I2=I3), it results:

$$I3/\beta_B>I3+I3*(1+\beta_P)$$

from which the following condition is obtained (to which hereafter it will be referred to as safety condition):

$$\beta_P*\beta_B<1$$

Therefore, if such safety condition is present, the thyristor formed by Tb and Tp, although possibly turning on, does not significantly affect the operation of the IGBT device 100.

For this reason, the IGBT device 100 is typically designed so that the current gains $\beta_P$ and $\beta_B$ are sufficiently lower than 1, so as not to trigger the latch-up phenomenon if the thyristor formed by Tb and Tp should turn on; however, since the current gains $\beta_P$ and $\beta_B$ may also vary during operation of the IGBT device 100, according to particular and specific operating conditions (e.g., temperature, frequency, or other), it may happen that the safety condition is nevertheless not satisfied at one or more specific operating points, and that the thyristor formed by Tb and Tp triggers the latch-up phenomenon, thereby causing the breakdown of the IGBT device 100.

Figure 2A:
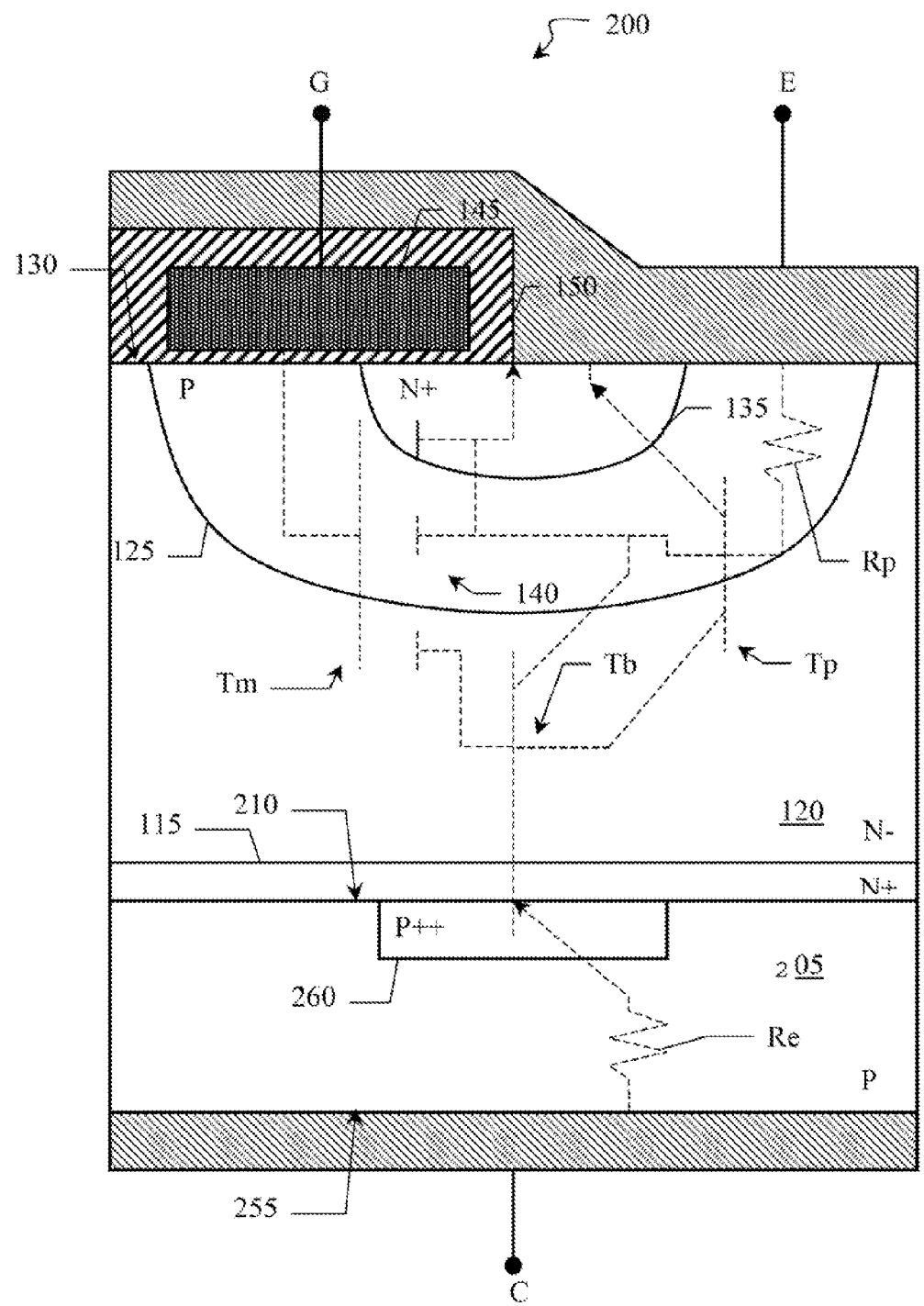
FIG. 2A schematically shows a structure of an IGBT device according to an embodiment and a corresponding equivalent electronic circuit.

Turning now to FIG. 2A, it shows a schematic sectional view of a structure of an IGBT device 200 according to an embodiment and a corresponding equivalent electronic circuit (represented by broken lines).

The IGBT device 200 differs from the device 100 described above in conjunction with FIGS. 1A and 1B by the presence of a composite structure of its substrate.

In particular, the IGBT device 200 now includes a substrate 205 (with an inner surface 210 and a rear surface 255) of P type, i.e., having a low impurity concentration (with respect to the device 100) such as to give a relatively high resistivity value thereto (e.g., approximately between 0.2 and 0.4 $\Omega$*cm).

A buried emitter region 260 of P++ type, i.e., having a dopant concentration greater than that of the substrate 205, extends within the substrate 205 from the inner surface 210 thereof; in an embodiment, the dopant concentration of the buried emitter region 260 is equal to or greater than by at least two decades (i.e., by $10^2$) the dopant concentration of the substrate 205; for example, the substrate 205 and the buried emitter region 260 may have concentrations of impurities of about $10^{14}$-$10^{16}$ ions/cm$^3$ and about $10^{16}$-$10^{18}$ ions/cm$^3$, respectively, and, for example equal to about $10^{15}$ and about $10^{18}$ ions/cm$^3$, respectively. The buried emitter region 260 may have a relatively small extent in plan view (in any plane parallel to the inner surface 210), so as to define an almost dot-like structure; for example, the buried emitter region 260 has a section in plan view with an area of the order of that of the source region 135, and more generally lower than that of the body region 125 (for example, of 30-80%, such as 40-60%). In this way, the buried emitter region 260 implements a high-efficiency emitter for the bipolar transistor Tb (since the current tends to flow through it, rather than through the rest of the substrate 205, thanks to its lower resistivity), whereas a residual portion of the substrate 205 interposed between the buried emitter region 260 and the collector terminal C defines an emitter resistor Re (whose value depends on the resistivity of the substrate 205 and on an extent of its residual portion).

In the exemplary illustrated embodiment, the emitter region 260 is obtained selectively (i.e., defined photolithographically) by ion implantation of impurities into a buried portion of the substrate 205 (before the formation of the active layer 115); such implantation may be carried out at a depth from the inner surface 210 approximately between 0.3 and 0.5 µm such as to involve a beam current not exceeding about 1 mA. In this way, the inner surface 210 of the substrate 205 is left sufficiently free from crystallographic defects, and, therefore, the subsequent process of epitaxial growth of the buffer layer 115 may be performed by avoiding the use of preliminary thermal processes for recovering lattice defects. Moreover, since a peak of concentration of the implanted impurities is buried, the impurity concentration is only marginally localized at the inner surface 210, thus preventing possible phenomena of dopant out-diffusion and self-doping during the subsequent epitaxial growth process.

Figure 2B:
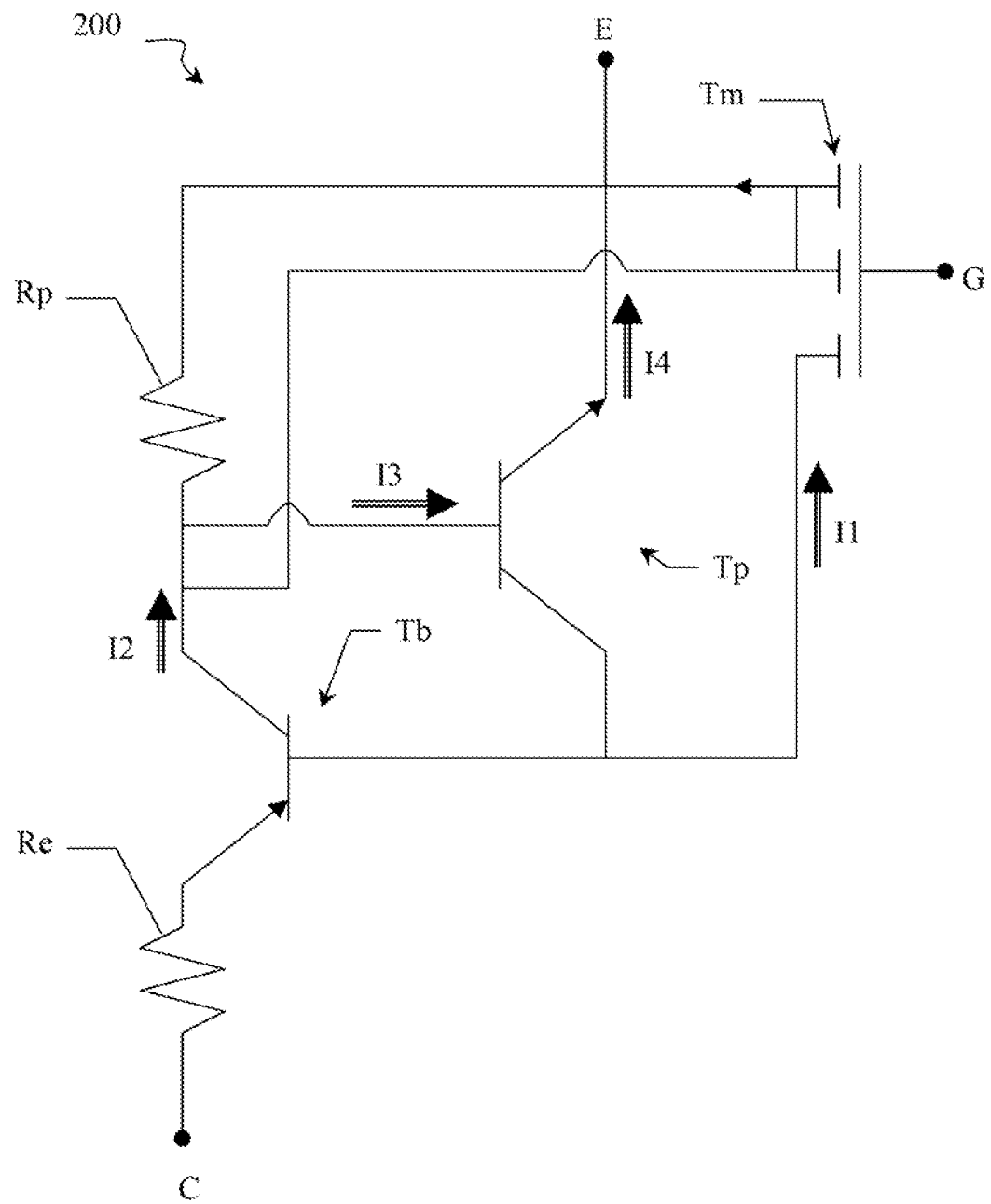
FIG. 2B shows the equivalent electronic circuit illustrated in FIG. 2A.

As above, in order to illustrate the principles of operation of the IGBT device 200, reference will be now made to FIG. 2B, which only shows the equivalent electronic circuit of FIG. 2A for the sake of simplicity.

Figure 1B:
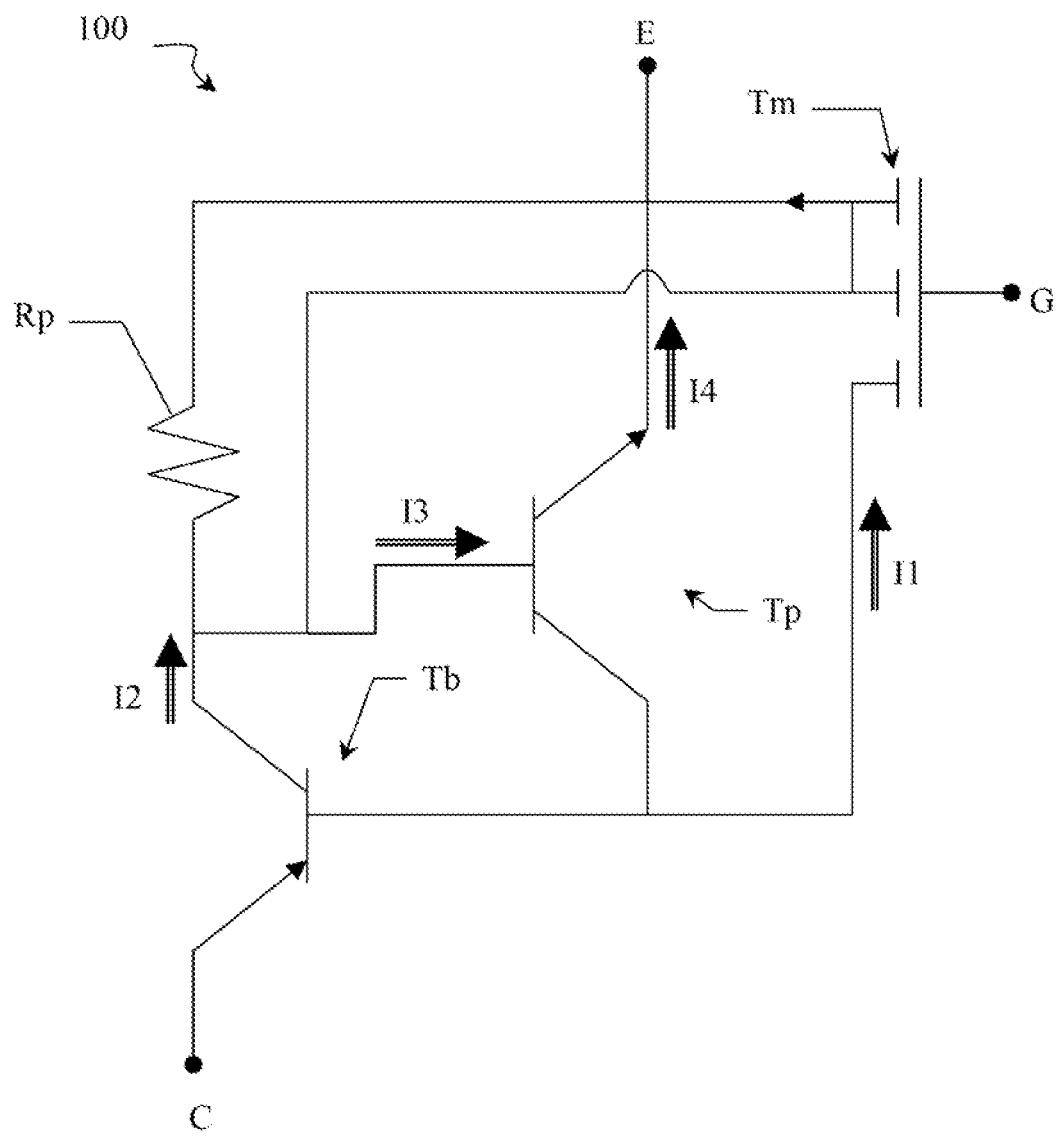
FIG. 1B shows the equivalent electronic circuit illustrated in FIG. 1A.

The operation of the IGBT 200 is similar to that described in FIG. 1B, with the difference that, in operating conditions, the current I2 within the collector of the bipolar transistor Tb now comes from a high efficiency emitter (thanks to the high concentration of dopants within the buried emitter region 260), and it is collected by the collector terminal C through a relatively high impedance path (thanks to the emitter resistor Re).

In particular, let us assume an initial condition in which the MOS transistor Tm supplies a high current I1 (for example, as in case of driving of a large load), and such as to establish a potential difference across the parasitic resistor Rp capable of turning on the parasitic transistor Tp. If at the same time the safety condition is not satisfied any longer, the current I2 within the emitter of the bipolar transistor Tb begins growing further on; such current, however, by crossing the emitter resistor Re, causes a drop of the potential across it that de-biases the emitter region 260; in this way, the current I2 of the bipolar transistor Tb decreases (as well as the potential difference across the parasitic resistor Rp), thereby causing the turning off of the parasitic transistor Tp before the parasitic thyristor formed by Tm and Tp might trigger the latch-up phenomenon. In other words, the collector terminal C being at a fixed voltage (e.g., a supply voltage), an increase of the current I2 involves a decrease of the voltage at the emitter of the bipolar transistor Tb; in this way, the bipolar transistor Tb, being affected by a reduction of the potential difference between its base and its emitter, is less conductive, and the current I2 decreases.

An embodiment may be advantageous since it allows avoiding the breakdown of the IGBT device 200 (and possibly also of the load being driven by it), by quickly and effectively interrupting the triggering of the latch-up phenomenon of the thyristor formed by Tm and Tp. This may make an embodiment capable of also being used in applications that require high performance and reliability.

Such result may be achieved without substantially adversely affecting the performance of the IGBT device 200. In fact, the performance loss that might be caused by the emitter resistor Re may be counterbalanced by the efficiency increase of the buried emitter region 260.

Figure 3A:
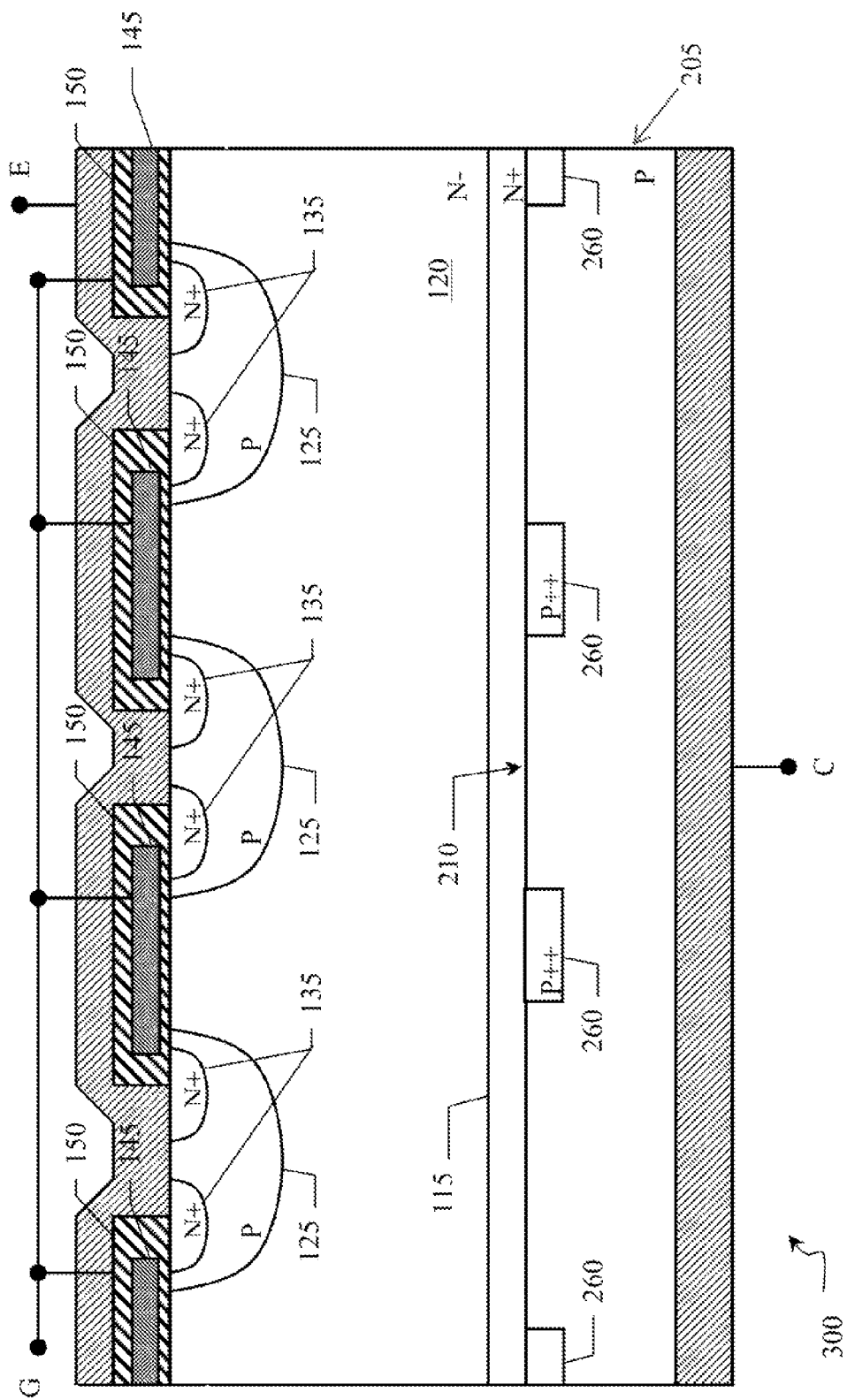
FIG. 3A shows a schematic sectional view of an IGBT complex structure according to an embodiment.

FIG. 3A shows a schematic sectional view of an IGBT complex structure 300 according to an embodiment. The structure 300 includes a plurality (six, in the exemplary illustrated in the figure) of approximately identical IGBT devices according to the embodiment of FIG. 2A, all of them being integrated in a same chip of semiconductor material.

In particular, the substrate 205 and the active layer 115,120 are common to all the IGBT devices 200; the IGBT devices 200 are arranged in groups (in pairs in the example at issue), each one of which shares a same body region 125 (inside which the different corresponding source regions 135 are placed, two in the example at issue). Moreover, each group of adjacent IGBT devices 200, but with different body regions 125 (in pairs in the example at issue), share a same gate element 145, which extends over the corresponding channel regions (and over the portion of the active layer 115,120 between them). The collector terminal C, the emitter terminal E and the gate terminal G are common to all the IGBT devices 200. Finally, the adjacent IGBT devices 200 of each group (with different body regions 125) share a same buried emitter region 260. For example, the buried emitter region 260 is arranged in plan view between the corresponding body regions 125; for example, the buried emitter region 260 is placed in plan view at the center of such body regions 125 (so as to be approximately equidistant from them).

Such an embodiment may be advantageous since the sharing of a same buried emitter region 260 allows easily integrating a very large number of IGBT devices 200; this allows obtaining, in integrated complex systems (i.e., including both the structure 300 and other integrated circuits, being not shown), a considerable saving both in terms of area occupation and in terms of production costs.

Figure 3B:
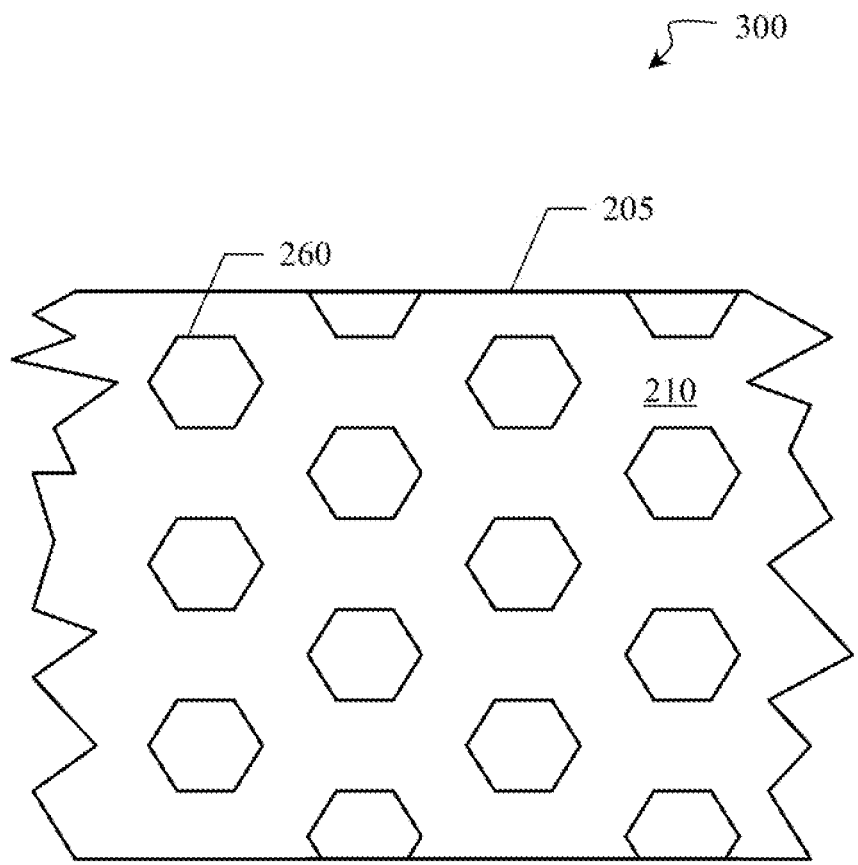
FIG. 3B shows a plan view of a portion of the IGBT complex structure of FIG. 3A.

Turning now to FIG. 3B, it shows a plan view of a portion of an embodiment of the complex structure 300 sectioned along the inner surface 210.

As visible in such figure, each buried emitter region 260 has a section in plan view with a regular polygon shape; in the particular embodiment illustrated, each buried emitter region 260 has a regular hexagon shape. In this way, since the regular hexagon is a geometric figure having an intrinsic property of tessellation, it may be possible to ensure a uniform and regular spatial arrangement of the buried emitter regions 260 (i.e., at a fixed reciprocal distance).

Such embodiment may be advantageous since, in case of integration of a very large number of IGBT devices, it ensures that the buried emitter regions 260 are arranged evenly throughout the whole substrate 205, thereby substantially eliminating areas of the substrate 205 which may be not associated with at least one emitter region 260. In this way, each IGBT device is associated with at least one buried emitter region 260, thereby ensuring a correct operation of the complex structure 300.

Naturally, in order to satisfy local and specific requirements, one may apply to the one or more embodiments described above many logical and/or physical modifications and alterations. More specifically, although one or more embodiments have been described with a certain degree of particularity, it should be understood that various omissions, substitutions, and changes in the form and details as well as other embodiments are possible. In particular, different embodiments may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment may be incorporated in any other embodiment as a matter of general design choice.

For example, similar considerations apply if the IGBT device has a different structure or includes equivalent components (either separated from each other or combined together, in whole or in part); for example, the same considerations apply if the IGBT device has inverted doping (for implementing, for example, an IGBT device with a P-channel MOS transistor and an NPN bipolar transistor); moreover, the values of dopant concentration indicated in the description should not be construed in a restrictive way, as they may be properly modified, by a producer, according to technical or specific considerations. Moreover, the relative or absolute size being indicated or inferable for the various layers and/or regions of the structure that implements the IGBT device are only indicative, and in particular they are also due to technological limitations of the state of the art. In this respect, the buffer layer may have any size; at the limit, it may also be not necessary, for example, if technologies were available that allow designing the current gain of the bipolar transistor acting on different construction parameters.

The same considerations apply if the buried emitter region is slightly below the inner surface of the substrate.

Moreover, the ratio between the concentration of dopants within the buried emitter region and that of dopants within the substrate should not be construed in a limitive manner, and it may also be lower or higher than that indicated in the description.

Moreover, nothing prevents the IGBT device from being provided with more than one buried emitter region.

It is also not excluded that the buried emitter regions may have different extent in plan view (and/or in depth) than described herein; moreover, different buried emitter regions possibly associated with the IGBT device may also be different from each other.

The specified shape for the buried emitter regions is not limitative; in fact, it may be possible to form the buried emitter regions with the shape of other geometric figures (even not regular) having analogous or similar tessellation properties (e.g., triangle and square).

Moreover, similar considerations apply if the IGBT complex structure has a different structure or includes equivalent components (either separated from each other or combined together, in whole or in part); in particular, the same considerations apply if the IGBT devices composing such complex structure are in any number and grouped in any way. For example, the body region and the gate element may be shared by two or more IGBT devices (e.g., with strips-shaped body regions and gate elements extending along the entire chip). Moreover, in some implementations, the collector terminal, the emitter terminal, and/or the gate terminal of the IGBT complex structure may be coupled to each other by a user in various ways downstream the corresponding production process (e.g., by programming switches through a software interface).

In any case, nothing prevents having each IGBT device with one or more corresponding dedicated buried emitter regions (for example, being arranged in plan view below the corresponding channel region).

The arrangement of the buried emitter regions may be in any pattern (even an irregular pattern), and in particular it may be chosen according to specific design considerations; for example, the buried emitter regions may be spaced apart from each other in variable way, or according to complex spatial distribution schemes.

In addition, an embodiment lends itself to be implemented through an equivalent method (by using similar steps, removing some steps being not essential, or adding further optional steps); moreover, the steps may be performed in different order, concurrently, or in an interleaved way (at least partly).

It should be readily understood that the design of the IGBT device may also be created in a programming language; moreover, if the designer does not manufacture the corresponding integrated devices or masks, the design may be transmitted by physical means to others. In any case, the resulting IGBT device may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a controller such as a processor). In any case, the integrated device is suitable to be used in complex systems (such as automotive applications or microcontrollers).

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An integrated circuit, comprising:
a field-effect transistor having a field-effect control node and first and second field-effect conduction nodes;
a first bipolar transistor disposed in a semiconductor region having a first bipolar control node coupled to the first field-effect conduction node, a first bipolar conduction node coupled to the second field-effect conduction node, and a second bipolar conduction node; and
a first impedance disposed in the semiconductor region and coupled to the second bipolar conduction node and disposed apart from the first bipolar control node.

2. The circuit of claim 1 wherein the field-effect transistor has a body node coupled to the second field-effect conduction node.

3. The circuit of claim 1 wherein the field-effect transistor has a body node coupled to the first bipolar conduction node.

4. The circuit of claim 1, further including a second impedance coupled between the second field-effect conduction node and the first bipolar conduction node.

5. The circuit of claim 1, further including a second bipolar transistor having a second bipolar control node coupled to the first bipolar conduction node, a third bipolar conduction node coupled to the second field-effect conduction node, and a fourth bipolar conduction node coupled to the first bipolar control node.

6. The circuit of claim 1 wherein:
the first and second field-effect conduction nodes respectively include a drain and a source;
the first bipolar control node includes a base; and
the first and second bipolar conduction nodes respectively include a bipolar collector and a bipolar emitter.

7. The circuit of claim 1 wherein the first impedance includes a resistive region.

8. The circuit of claim 1 wherein:
the second field-effect conduction node forms an insulated-gate-bipolar-transistor emitter node;
the field-effect control node forms an insulated-gate-bipolar-transistor gate node; and
the second bipolar conduction node forms an insulated-gate-bipolar-transistor collector node.

9. A system, comprising:
a first integrated circuit, including:
a field-effect transistor having a field-effect control node and first and second field-effect conduction nodes;
a first bipolar transistor disposed in a semiconductor region having a first bipolar control node coupled to the first field-effect conduction node, a first bipolar conduction node coupled to the second field-effect conduction node, and a second bipolar conduction node; and
a first impedance disposed in the semiconductor region and coupled to the second bipolar conduction node and disposed apart from the first bipolar control node; and
a second integrated circuit coupled to the first integrated circuit.

10. The system of claim 9 wherein one of the first and second integrated circuits includes a controller.

11. The system of claim 9 wherein the first and second integrated circuits are disposed on a same die.

12. The system of claim 9 wherein the first and second integrated circuits are disposed on respective dies.

13. An integrated circuit, comprising:
a substrate;
a semiconductor region disposed over the substrate;
a field-effect transistor having a field-effect control node and first and second field-effect conduction nodes;
a first bipolar transistor having a first bipolar control node coupled to the first field-effect conduction node, a first bipolar conduction node coupled to the second field-effect conduction node, and a second bipolar conduction node; and
a first portion of the semiconductor region disposed adjacent to the substrate and coupled to the second bipolar conduction node and having a concentration of impurities higher than a concentration of impurities of the substrate.

14. The integrated circuit of claim 13 wherein the first portion of the semiconductor region comprises a buried region.

15. The integrated circuit of claim 13 wherein the first portion of the semiconductor region is contiguous with the substrate.

16. The integrated circuit of claim 13 wherein the first portion of the semiconductor region comprises a polygonal-shaped boundary.

17. The integrated circuit of claim 13; further comprising:
a second field-effect transistor having a second field-effect control node and third and fourth field-effect conduction nodes;
a second bipolar transistor having a second bipolar control node coupled to the third field-effect conduction node, a third bipolar conduction node coupled to the fourth field-effect conduction node, and a fourth bipolar conduction node; and
a second portion of the semiconductor region coupled to the fourth bipolar conduction node and having a concentration of impurities higher than a concentration of impurities of the substrate.

18. The integrated circuit of claim 17, wherein:
the first bipolar transistor is arranged between the first and second portions; and
the second portion is arranged between the first bipolar transistor and the second bipolar transistor.

\* \* \* \* \*